(12) United States Patent
Miki et al.

(10) Patent No.: US 6,610,168 B1
(45) Date of Patent: Aug. 26, 2003

(54) RESIST FILM REMOVAL APPARATUS AND RESIST FILM REMOVAL METHOD

(75) Inventors: Nobuhiro Miki, Tokyo (JP); Takahisa Nitta, Tokyo (JP)

(73) Assignees: Sipec Corporation, Tokyo; Ultra Clean Technology Corporation, Tokyo ( * ) Notice: Subject to any disclaimer, the term of this patent is extended or adjusted under 35 U.S.C. 154(b) by 67 days.

(21) Appl. No.: 09/636,821

(22) Filed: Aug. 14, 2000

Related U.S. Application Data

(63) Continuation-in-part of application No. 09/416,416, filed on Oct. 12, 1999.

(30) Foreign Application Priority Data

| Aug. 12, 1999 | (JP) | 11-228917 |
| Oct. 12, 1999 | (JP) | 11-325913 |
| Dec. 28, 1999 | (JP) | 11-375228 |
| Mar. 10, 2000 | (JP) | 2000-067782 |

(51) Int. Cl.$^7$ ................................................ B08B 5/00
(52) U.S. Cl. .................... 156/344; 134/26; 134/30; 134/39; 430/256; 430/260
(58) Field of Search ................ 156/344, 584, 156/247; 430/260, 256; 134/34, 36, 37, 30, 41, 26, 39

(56) References Cited

U.S. PATENT DOCUMENTS

| 4,028,135 A | * | 6/1977 | Vig et al. ....................... 134/1 |
| 4,631,250 A | * | 12/1986 | Hayashi .......................... 134/7 |
| 4,778,536 A | * | 10/1988 | Grebinski ....................... 134/11 |
| 4,867,799 A | * | 9/1989 | Grebinski ....................... 134/11 |
| 4,885,047 A | * | 12/1989 | Ury et al. ....................... 134/1 |
| 4,983,254 A | * | 1/1991 | Fujimura et al. ............... 134/1 |
| 5,105,556 A | * | 4/1992 | Kurokawa et al. ............. 134/11 |
| 5,399,202 A | * | 3/1995 | Kikuchi et al. ................. 134/1 |
| 5,667,139 A | * | 9/1997 | Dickie ........................... 122/390 |
| 5,695,569 A | * | 12/1997 | Douglas ....................... 134/1.3 |
| 6,178,973 B1 | * | 1/2001 | Franca et al. ................. 134/1.3 |
| 6,277,205 B1 | * | 8/2001 | Nagamura et al. ............. 134/1 |

* cited by examiner

Primary Examiner—Richard Crispino
Assistant Examiner—Cheryl N. Hawkins
(74) Attorney, Agent, or Firm—Connolloy Bove Lodge & Hutz LLP

(57) ABSTRACT

A line slit nozzle for spraying steam is disposed along a diameter of a resist film. Steam containing a mist is sprayed onto a surface of the resist film. The film is thereby peeled off and removed. By using a change in physical properties (swelling, etc.) of the resist film by water, the film is easily and surely peeled off. Breakaway from much resources/energy consumption type techniques is realized. In other words, realized are environment-symbiosis type techniques by which resist films can be removed independently of the quantity of energy and kinds of chemical solvents.

3 Claims, 7 Drawing Sheets

OXIDE FILM DRY-ETCHED SURFACE

GATE ELECTRODE ETCHED SURFACE

OXIDE FILM ETCHED /ION-IMPLANTED SURFACE[P/80KeV/6E15]

OXIDE FILM WET-ETCHED SURFACE

METAL WIRING ETCHED/ION-IMPLANTED SURFACE

RESIST FILM REMOVAL APPARATUS AND RESIST FILM REMOVAL METHOD

CROSS-REFERENCE TO RELATED APPLICATION

This application is a continuation-in-part of copending U.S. patent application Ser. No. 09/416,416, filed Oct. 12, 1999.

BACKGROUND OF THE INVENTION

1. Field of the Invention

The present invention relates to apparatus and methods for removing resist (photoresist) films, indispensable to photolithographic processes for making minute structures of semiconductor integrated circuits or the like.

2. Description of the Related Art

As techniques for removing resist films, presently known are ashing methods in which a resist film to be removed is ashed with oxygen plasma, and heating and dissolving methods in which a resist film to be removed is dissolved using an organic solvent, such as a phenol- or halogen-base organic solvent, with being heated at 90 to 130° C., or using concentrated sulfuric acid and hydrogen peroxide. Any of these techniques requires a certain time, much energy and a specific chemical material for decomposing or dissolving the resist film. This was a strain on the photolithographic process. In spite of a great demand for new resist removing techniques to replace the above techniques by ashing or dissolving, developments of peeling techniques are yet few. As a representative of such peeling techniques, a new technique has been developed in which a peeling liquid newly developed and the peeling action of high-frequency supersonic waves are used. As such a peeling liquid, the peeling action of "an IPA-HzOz-base ingredient+salt such as fluoride" has been appreciated.

SUMMARY OF THE INVENTION

It is an object of the present invention to provide resist film removing apparatus and methods in which resist films can be peeled off by using a change in physical properties and a change in structure of the resist films due to application of steam and ultraviolet rays, and thereby to realize breakaway from much resources/energy consumption type techniques, that is, to realize environment-symbiosis type techniques by which resist films can be removed independently of the quantity of energy and kinds of chemical solvents.

More specifically, the present invention is directed to removal of resist films by using a change in physical properties, such as softening, expansion, hydration, swelling, or solidification, or a change in structure, such as cross-linking, oxidation, or decomposition, of the resist films due to application of steam and ultraviolet rays. Additive ingredients for promoting such a change in quality may be selectively used.

In other words, the present invention is directed to removal of resist films by a timely cross-combination, a spatially proper cross-combination, a proper cross-combination on temperature, or a chemically proper cross-combination of all or some of means for (or process of) spraying steam, compressed water, or compressed carbonic acid gas onto a resist film, means for (or process of) adding a chemical ingredient to the steam or compressed water, means for (or process of) heating or cooling the substrate holding thereon the resist film, and means for (or process of) irradiating the resist film with ultraviolet rays.

The present inventors have taken up the following elemental techniques as subjects, and studied and developed them:

Change in quality of resist films by steam;
Chemical promotion of quality change of resist films; and
Promotion of quality change of resist films by irradiation with ultraviolet rays.

According to an aspect of the present invention, an apparatus for removing a resist film used in a lithographic process, comprises: means for bringing steam into contact with the resist film; and means for spraying steam onto the resist film, wherein the resist film is peeled off by an action of steam.

According to an aspect of the present invention, the resist film is peeled off with saturated or superheated steam at a temperature within the range of 70° C. to 200° C.

According to an aspect of the present invention, an apparatus for removing a resist film used in a lithographic process, comprises: means for spraying saturated steam onto the resist film, wherein the resist film is peeled off by an action of the saturated steam.

According to an aspect of the present invention, the temperature of the saturated steam at the target surface is within the range of 70° C. to 100° C.

According to an aspect of the present invention, steam containing an ingredient for promoting a change in quality of the resist film is brought into contact with and/or sprayed onto a surface of the resist film to peel the resist film.

According to an aspect of the present invention, the apparatus comprises a steam supply system including a subsystem for generating steam, a subsystem for heating steam, a subsystem for controlling the water quantity to be supplied and the heat amount for heating, and a subsystem for controlling the pressure of steam. The steam supply system is connected to an ultrapure water supply line for selectively supplying saturated or superheated steam at a temperature within the range of 70° C. to 200° C.

According to an aspect of the present invention, the steam supply system further includes a subsystem for switching lines between the ultrapure water supply line and a line for a solution containing an ingredient for promoting a change in quality of the resist film, and an injecting pump for the ingredient, so that steam containing the ingredient and steam not containing the ingredient can be switched over.

According to an aspect of the present invention, the apparatus further comprises an ultraviolet reactor including an ultraviolet lamp of a wavelength corresponding to a transmissive distance of not less than 10 mm to steam. The ultraviolet lamp is disposed in parallel with a substrate surface on which the resist film is formed. The substrate surface can be irradiated while and after the resist film is peeled off the substrate surface by the action of steam.

According to an aspect of the present invention, the apparatus further comprises a chamber provided with a system for taking in a substrate on which the resist film is formed and taking out the substrate off which the resist film has been peeled, a system for purging an atmosphere in the chamber, a system for discharging gas or liquid from the chamber, a system for introducing steam into the chamber, and a system for driving a steam spraying nozzle to move relatively to the substrate surface on which the resist film is formed, so as to sweep the substrate surface. The steam spraying nozzle sprays steam onto the substrate surface to peel the resist film off the substrate surface.

According to an aspect of the present invention, the chamber is further provided with a system for supplying carbonic acid gas from a gas bomb into the chamber, and a gas spraying nozzle for spraying carbonic acid gas onto the substrate surface rapidly to cool the resist film to be peeled off.

According to an aspect of the present invention, the apparatus further comprises a supply line for a liquid chemical for cleaning a substrate, connected to the steam supply system, wherein the substrate off which the resist film has been peeled is cleaned by irradiation with ultraviolet rays and spraying steam, and then dried by spraying superheated steam.

According to an aspect of the present invention, the apparatus further comprises a filter for filtering off pieces of the resist film having been peeled off a substrate and contained in a liquid being discharged, or a centrifugal separator for separating the pieces from the liquid, wherein the liquid from which the pieces have been removed is reused.

According to an aspect of the present invention, a method for removing a resist film used in a lithographic process, comprises steps of: bringing saturated or superheated steam into contact with the resist film; and spraying saturated or superheated steam onto the resist film, wherein the resist film is peeled off by an action of steam.

According to an aspect of the present invention, steam containing an ingredient for promoting a change in quality of the resist film is brought into contact with a surface of the resist film to peel the resist film.

According to an aspect of the present invention, in a method for removing a resist film used in a lithographic process, saturated steam is sprayed onto the resist film, and the resist film is peeled off by an action of the saturated steam.

According to an aspect of the present invention, the temperature of the saturated steam at the target surface is within the range of 70° C. to 100° C.

According to an aspect of the present invention, a substrate surface on which the resist film is formed, is irradiated with excimer ultraviolet rays of a wavelength corresponding to a transmissive distance of not less than 10 mm to steam, while and after the resist film is peeled off the substrate surface by the action of steam.

According to an aspect of the present invention, organic, metallic, and granular contaminants are removed from a substrate surface off which the resist film has been peeled, by spraying steam with irradiating the substrate surface with ultraviolet rays, and then the substrate surface is cleaned and dried by spraying steam.

According to an aspect of the present invention, steam containing an ingredient for promoting a change in quality of the resist film is brought into contact with and/or sprayed onto a surface of the resist film to peel the resist film.

According to an aspect of the present invention, an apparatus for removing a resist film used in a lithographic process, comprises: means for making steam act on the resist film, wherein the resist film is peeled off by the action of the steam.

According to an aspect of the present invention, the steam is saturated steam, and the temperature of the saturated steam at the target surface is within the range of 70° C. to 100° C.

According to an aspect of the present invention, steam containing an ingredient for promoting a change in quality of the resist film is made to act on a surface of the resist film to be peeled off.

According to an aspect of the present invention, the apparatus further comprises at least one of: means for making water act on the resist film; means for making vapor of isopropyl alcohol act on the resist film; means for making compressed carbonic acid gas act on the resist film; means for adding a chemical ingredient into the steam and/or the water; means for irradiating the resist film with ultraviolet rays; means for applying high-frequency supersonic waves to the resist film; and means for cooling a substrate on which the resist film is formed, wherein the resist film is peeled off by properly cross-combining at least one of time and/or spatial conditions, conditions on temperature, and physical and/or chemical conditions for operating each of the means.

According to an aspect of the present invention, the apparatus further comprises a one-by-one process chamber in which substrates to be processed are disposed one by one. The chamber is provided with a system for taking in and out the substrates, a system for purging the atmosphere in the chamber, and a system for discharging gas or liquid from the chamber, in addition to the above means. The chamber is further provided with a driving system for at least one of the means for making steam act on the resist film, the means for making water act on the resist film, and the means for making compressed carbonic acid gas act on the resist film, to move relatively to the front or back surface of each substrate.

According to an aspect of the present invention, as the above time and/or spatial conditions for operating the above means and/or the above systems, the order of the operations and the intervals of the operations are properly cross-combined in relation to the portions subjected to the operations, i.e., the surface of the resist film, both or one of the front and rear surfaces of the substrate, or part of the front or rear surface of the substrate.

According to an aspect of the present invention, as the above conditions on temperature for operating the above means and/or the above systems, process temperatures and the raising and lowering speeds thereof are properly cross-combined in relation to the portions subjected to the operations, i.e., the surface of the resist film, both or one of the front and rear surfaces of the substrate, or part of the front or rear surface of the substrate.

According to an aspect of the present invention, as the above physical and/or chemical conditions for operating at least one of the means for adding a chemical ingredient into the steam and/or the water, the means for irradiating the resist film with ultraviolet rays, and the means for applying high-frequency supersonic waves to the resist film, the compositions of chemical ingredients for the steam and/or the water, the frequencies of supersonic waves, and the wavelengths of ultraviolet rays are properly cross-combined.

According to an aspect of the present invention, the above time and/or spatial conditions, the above conditions on temperature, and the above physical and/or chemical conditions are properly cross-combined with one another.

According to an aspect of the present invention, the means for making steam act on the resist film has the function of bringing the steam into contact with the resist film and the function of spraying the steam onto the resist film. The contact process and the spraying process are properly cross-combined.

According to an aspect of the present invention, the means for making steam act on the resist film has the function of making saturated steam act on the resist film and the function of making superheated steam act on the resist film. The saturated steam process and the superheated steam process are properly cross-combined.

According to an aspect of the present invention, the steam process by the means for making steam act on the resist film, and a chemical ingredient composition determined by the means for adding a chemical ingredient into the steam are properly cross-combined.

According to an aspect of the present invention, the steam process by the means for making steam act on the resist film, and the water spraying process by the means for making water act on the resist film are properly cross-combined.

According to an aspect of the present invention, the steam process by the means for making steam act on the resist film, and the ultraviolet irradiation process by the means for irradiating the resist film with ultraviolet rays are properly cross-combined.

According to an aspect of the present invention, the steam process by the means for making steam act on the resist film, and the high-frequency supersonic application process by the means for applying high-frequency supersonic waves to the resist film are properly cross-combined.

According to an aspect of the present invention, the steam process by the means for making steam act on the resist film, and the compressed carbonic acid gas spraying process by the means for making compressed carbonic acid gas act on the resist film are properly cross-combined.

According to an aspect of the present invention, the steam process by the means for making steam act on the resist film, and the cooling process by the means for cooling a substrate on which the resist film is formed, are properly cross-combined.

According to an aspect of the present invention, the steam process by the means for making steam act on the resist film, and the vapor process by the means for making vapor of isopropyl alcohol act on the resist film are properly cross-combined.

According to an aspect of the present invention, the compressed carbonic acid gas spraying process by the means for making compressed carbonic acid gas act on the resist film, and the ultraviolet irradiation process by the means for irradiating the resist film with ultraviolet rays are properly cross-combined.

According to an aspect of the present invention, by properly cross-combining the above time and/or spatial conditions, the above conditions on temperature, and the above physical and/or chemical conditions for operating the above means and/or the above systems, the substrate surface off which the resist film has been peeled is processed to remove residues of the resist film and alien substances. The substrate surface is thereby purified.

According to an aspect of the present invention, a method for removing a resist film used in a lithographic process, comprises a step of making steam act on the resist film, wherein the resist film is peeled off by the action of the steam.

According to an aspect of the present invention, the method further comprises at least one of: a step of making water act on the resist film; a step of making vapor of isopropyl alcohol act on the resist film; a step of making compressed carbonic acid gas act on the resist film; a step of adding a chemical ingredient into the steam and/or the water; a step of irradiating the resist film with ultraviolet rays; a step of applying high-frequency supersonic waves to the resist film; and a step of cooling a substrate on which the resist film is formed, wherein the resist film is peeled off by properly cross-combining at least one of time and/or spatial conditions, conditions on temperature, and physical and/or chemical conditions for performing each of the steps.

According to an aspect of the present invention, as the above time and/or spatial conditions for performing the above steps, the order of the steps and the intervals of the steps are properly cross-combined in relation to the portions subjected to the steps, i.e., the surface of the resist film, both or one of the front and rear surfaces of the substrate, or part of the front or rear surface of the substrate.

According to an aspect of the present invention, as the above conditions on temperature for performing the above steps, process temperatures and the raising and lowering speeds thereof are properly cross-combined in relation to the portions subjected to the steps, i.e., the surface of the resist film, both or one of the front and rear surfaces of the substrate, or part of the front or rear surface of the substrate.

According to an aspect of the present invention, as the above physical and/or chemical conditions for performing at least one of the step of adding a chemical ingredient into the steam and/or the water, the step of irradiating the resist film with ultraviolet rays, and the step of applying high-frequency supersonic waves to the resist film, the compositions of chemical ingredients for the steam and/or the water, the frequencies of supersonic waves, and the wavelengths of ultraviolet rays are properly cross-combined.

According to an aspect of the present invention, the above time and/or spatial conditions, the above conditions on temperature, and the above physical and/or chemical conditions are properly cross-combined with one another.

According to an aspect of the present invention, the step of making steam act on the resist film includes a sub-step of bringing the steam into contact with the resist film and a sub-step of spraying the steam onto the resist film. The contact process and the spraying process are properly cross-combined.

According to an aspect of the present invention, the step of making steam act on the resist film includes a sub-step of making saturated steam act on the resist film and a sub-step of making superheated steam act on the resist film. The saturated steam process and the superheated steam process are properly cross-combined.

According to an aspect of the present invention, the steam process by the step of making steam act on the resist film, and a chemical ingredient composition determined in the step of adding a chemical ingredient into the steam are properly cross-combined.

According to an aspect of the present invention, the steam process by the step of making steam act on the resist film, and the water spraying process by the step of making water act on the resist film are properly cross-combined.

According to an aspect of the present invention, the steam process by the step of making steam act on the resist film, and the ultraviolet irradiation process by the step of irradiating the resist film with ultraviolet rays are properly cross-combined.

According to an aspect of the present invention, the steam process by the step of making steam act on the resist film, and the high-frequency supersonic application process by the step of applying high-frequency supersonic waves to the resist film are properly cross-combined.

According to an aspect of the present invention, the steam process by the step of making steam act on the resist film, and the compressed carbonic acid gas spraying process by the step of making compressed carbonic acid gas act on the resist film are properly cross-combined.

According to an aspect of the present invention, the steam process by the step of making steam act on the resist film, and the cooling process by the step of cooling a substrate on which the resist film is formed, are properly cross-combined.

According to an aspect of the present invention, the steam process by the step of making steam act on the resist film, and the vapor process by the step of making vapor of isopropyl alcohol act on the resist film are properly cross-combined.

According to an aspect of the present invention, the compressed carbonic acid gas spraying process by the step of making compressed carbonic acid gas act on the resist film, and the ultraviolet irradiation process by the step of irradiating the resist film with ultraviolet rays are properly cross-combined.

According to an aspect of the present invention, by properly cross-combining the above time and/or spatial conditions, the above conditions on temperature, and the above physical and/or chemical conditions for performing the above steps, the substrate surface off which the resist film has been peeled is processed to remove residues of the resist film and alien substances. The substrate surface is thereby purified.

According to the present invention, by using a change in physical properties (such as swelling) of a resist film by steam and a light decomposition effect by ultraviolet rays, it becomes possible to peel off the resist film easily and surely. As a result, breakaway from much resources/energy consumption type techniques can be realized, that is, an environment-symbiosis type technique independent of the quantity of energy and kinds of chemical solvents can be realized.

DETAILED DESCRIPTION OF THE PREFERRED EMBODIMENTS

Figure 1:
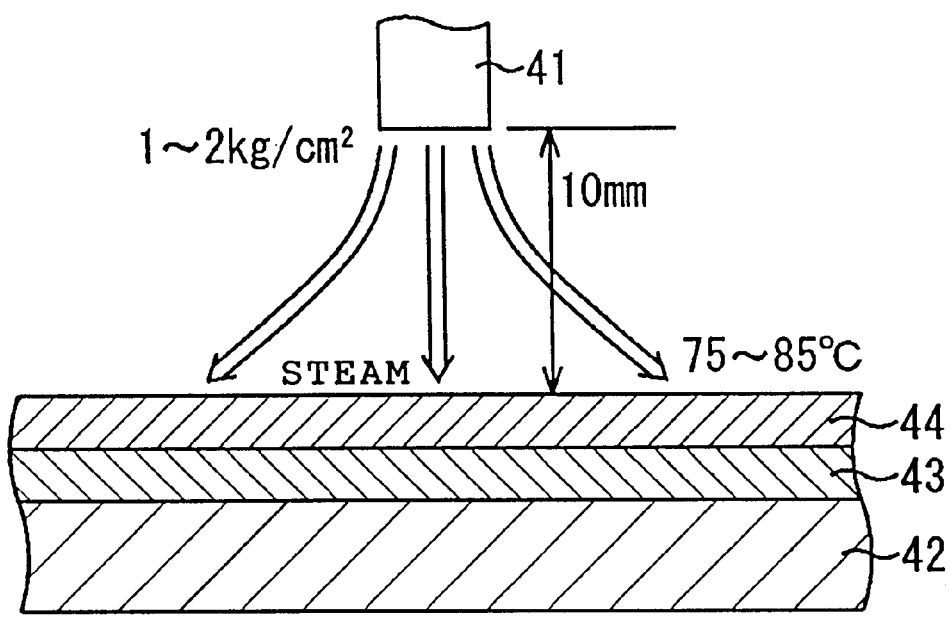
FIG. 1 is a schematic sectional view showing a portion near a spraying nozzle of a resist removing apparatus according to the present invention.

Hereinafter, preferred embodiments of the present invention will be described.

1. Peeling Resist Film by Steam

Porousness and Hydrogen Bondability of Chemical Structure of Resist Film:

In a photolithographic process for making a minute structure of, e.g., a semiconductor integrated circuit, a resist film is formed on a surface to be processed. Electromagnetic energy is then applied to the resist film through fine pattern gaps provided on an exposure mask. The thus formed pattern is developed in the resist film by using the difference in solubleness to a solvent between irradiated and non-irradiated portions of the resist film. The surface to be processed is then etched using the resist film pattern as an etching mask.

In such photolithographic processes, the wavelength of ultraviolet rays used has gradually become shorter with progress of the generations of degrees of integration. That is, g line, i line, and ArF to $F_2$ excimer lasers were used in this order. As a matter of course, the chemical structures of resist films have been reformed with shortening the used wavelength, and will be more reformed for future X-ray and electron ray photolithography ages. In reforming the chemical structures of resist films, it is important to grasp the physical properties of the basic structures unchanging fundamentally.

The present inventors have perceived the porousness and the hydrogen bondability of the basic structures of the base polymers of resist films.

Table 1 shows the basic structures of the base polymers of various photoresists from an initial resist KPR to currently mainstream resists, besides, resists for ARF excimer laser.

TABLE 1

| Base Polymer Basic Structure of Resist | | |
|---|---|---|
| first generation resist | vinyl cinnamate | 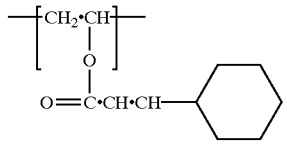 |
| resist for g to i line | cyclo-polyisoprene | 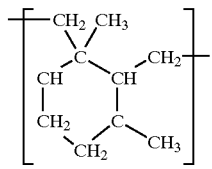 |
| " | novolac resin | 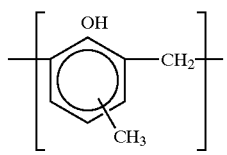 |

TABLE 1-continued

Base Polymer Basic Structure of Resist

| | | |
|---|---|---|
| resist for KrF | polymethyl methacrylate | $\left[\begin{array}{c} CH_3 \\ \vert \\ -CH_2\cdot C\cdot CH_2- \\ \vert \\ C=O \\ \vert \\ O\cdot CH_3 \end{array}\right]$ |
| " | polymethyl isopropenyl ketone | $\left[\begin{array}{c} CH_3 \\ \vert \\ -CH_2\cdot C\cdot CH_2- \\ \vert \\ C=O \\ \vert \\ CH_3 \end{array}\right]$ |
| " | chloromethyl polystyrene | $\left[\begin{array}{c} -CH_2\cdot CH- \\ \vert \\ \bigcirc \\ \vert \\ CH_2Cl \end{array}\right]$ |
| " | polystyrene sulfone | $\left[\begin{array}{c} -CH_2\cdot CH- \\ \vert \\ \bigcirc \end{array}\right] -SO_2-$ |
| " | polyvinyl phenol | $\left[\begin{array}{c} -CH_2\cdot CH- \\ \vert \\ \bigcirc \\ \vert \\ OR \end{array}\right]$  R = t-BOC |
| resist for ArF | alicyclic polymethacrylate | $\left[\begin{array}{c} CH_3 \\ / \\ -CH_2\cdot C \\ \backslash \\ C=O \end{array}\right]$ <br> $\vert$ <br> O-Alicyclic group |
| " | polybutene sulfone positive type | $\left[\begin{array}{c} CH_3 \\ / \\ -CH_2\cdot CH\cdot SO_2- \\ \backslash \\ CH_2\cdot CH_3 \end{array}\right]$ |

The chemical structures of the principal and side chains of these photoresists differ variously. But, in these various basic structures, there are two fundamental points of sameness.

They are the porousness of the basic structures and the hydrogen bondability of the constituent groups. Because of the cyclic structures or the structures having side chains of, e.g., alicyclic groups or phenol groups, the polymer basic structures have considerable spaces therein.

Besides, constituent groups having intensive hydrogen bondability, such as phenol groups, carbonyl groups, or ester groups, have been introduced. Introduction of these groups is necessary for the resists sensitively to react to light energy. Besides, resists must have solubility to developers, and the porousness and hydrogen bondability are physical properties necessary for the solubility.

Besides, the water permeabilities of resists are higher than those of other organic polymers. For example, while the water permeability ($Pa\cdot cm^3\cdot s^{-1}\cdot m^{-2}$) of Teflon, or polyethylene is about $3\times 10^{-11}$, those of resists are $10^{-8}$ to $10^{-7}$, showing their structures more permeable to water by three to four figures.

It is because the polymer structures of resists are porous in contrast to compactness of organic polymers having structural regularity, and further the polymer structures of resists have hydrogen bondability.

In future, resists will be required to be chemically amplificative, and addition of chemical amplification ingredients will be done.

But, "resist-peeling" is directed by base polymer basic structures. It is a characteristic feature of the present invention to utilize the porousness and hydrogen bondability which are fundamental properties of resists.

Change in Quality of Resist Film by Steam:

The present inventors has perceived the fact that the states of resist films change rapidly and remarkably by steam.

Physical changes such as softening/expansion due to hot steam occur naturally; besides, changes in physical properties such as swelling/separation/solidification occur. There have been found changes in chemical structure of the resist films though their aspects vary in accordance with the kinds of resists and conditions of steam. The details of such changes are supposed as follows.

Because the basic structures of the resist base polymers have porousness as described above, the resist transmissivity of steam is very high. A resist film is put in a pyrogenetic chemical reaction system the moment it comes into contact with steam. It is well known that the chemical action of water at a high temperature is intensive, and there are known many instances of hydrolysis of organic compounds by hot water. In a resist chemical structure, side chains having high hydrogen-bondability and photosensitive groups are present. Not only hydrolysis/oxidation of these groups but also cross-linking in the resist basic structure progresses.

Action of Saturated or Superheated Steam:

The temperature of steam necessary for processing a resist film varies in accordance with the kind of resist and conditions of the resist process. The steam temperature is selected to a suitable value of 70° C. to 200° C. The temperature may be more than 200° C. if circumstances of the substrate allow. In ultraviolet irradiation, superheated steam hardly brings about absorption and scattering of ultraviolet rays due to a mist, and it shows high efficiency of ultraviolet transmissivity. Besides, superheated steam is not affected by the mist when drying the surface from which a resist film has been peeled off.

Peeling Swelled Resist Film off Substrate by Spraying Steam:

The power of sprayed steam acts effectively for peeling a swelled resist film off a substrate. The resist film which has been hydrated/swelled and softened by hot steam, a mist, and further a swelling-promotion ingredient, is easily peeled off the substrate surface if the linear velocity of sprayed steam is several m/sec to scores m/sec. The peeling speeds depend on the kinds of resists. In particular, ion-implanted resist films have a tendency to be hard to peel off. Shape of pattern also exerts influence. In particular, high aspect ratio is a cause of the tendency to be hard to peel off. Considering such resist physical properties/substrate structures, the linear velocity and spraying time are controlled. In resist-peeling, it is important to control the spraying linear velocity in order not to damage the minute structure of the exposed surface.

Contact and Spraying of Steam:

Required is an apparatus capable of realizing a combination of a step of bringing a resist film into contact with steam to change the quality of the film, and a step of spraying steam onto the resist film which has changed in quality, to peel off.

The surface structure exposed as a result of resist-peeling must be protected without any damage.

While the power of sprayed steam at a linear velocity of one m/sec to scores m/sec is strong and effective for resist-peeling, it may damage the device surface. A two-step process is effective in which change in quality of a resist film is made to progress in a contact step, and then the film is peeled off in a spraying step of a short time. This is suitable in particular for removing an ion-implanted resist film in which the speed of change in quality is low, or a resist film on a surface where a structural aspect ratio is high.

Resist-peeling Only by Spraying Saturated Steam:

The present inventors have thought out a process of peeling a resist film only by spraying steam containing droplets, i.e., saturated steam, without using the above-described two-step process of the contact and spraying steps of steam.

More specifically, as shown in FIG. 1 for example, to remove a resist film 44 after patterning a $SiO_2$ film 43 on a substrate 42, a steam spraying nozzle 41 is disposed to be opposed to the resist film 44, and steam is sprayed to peel the resist film 44. In spraying conditions of this case, the temperature of saturated steam at the portion which steam reaches, i.e., the surface portion of the resist film 44, is controlled within the range of 70° C. to 100° C., more preferably, within the range of 75° C. to 85° C. This is because sprayed steam makes saturated steam containing droplets, suitable for peeling the resist film 44, at the surface portion of the resist film 44 when the temperature is controlled within the above range. FIG. 1 shows an example for realizing the above temperature range, in which the distance from the spraying nozzle 41 to the surface of the resist film 44 is 10 mm. Besides, the spraying pressure of steam at the mouth of the spraying nozzle 41 is controlled to be less than 10 $kg/cm^2$, more preferably, within the range of 1 to 2 $kg/cm^2$. If the pressure exceeds 10 $kg/cm^2$, the spraying nozzle 41 and device elements formed on the substrate 42 may be adversely affected.

A process in which a contact step uses steam containing an ingredient for promoting change in quality of a resist film as described in the next section, and a spraying step uses pure water steam, is effective for preventing a metal wiring surface from being damaged.

Ingredient for Promoting Change in Quality of Resist:

It has been found that a change in physical properties/ structure by hot steam can be accelerated by making the steam contain an ingredient for promoting the change in quality. In particular, a resist film hardened by an ion-implantation process is very hard to peel off. In spite of this fact, however, it can rapidly be peeled off by using steam which contains a promotion ingredient. Since the kind of effective promotion ingredient varies in accordance with the kind of resist, it need be selected individually. Protection of a structural substrate after resist-peeling, e.g., chemical action on a metal surface of a metal wiring substrate need be considered.

Oxidative substances are effective as promotion ingredients for cross-linking or oxidation. For example, hydrogen peroxide can make even an ion-implantation-processed resist film change in quality/be peeled off in a short time. We suppose that it is by oxidation of chemical bonding in the resist because of intensive radical reaction. Ozone water is also effective as a promotion ingredient for oxidation.

Also usable are other oxidative substances, such as $Cl_2$—$H_2O$, $Br_2$—$H_2O$, $I_2$—KI, NaClO, $NaClO_4$, $KMnO_4$, $K_2CrO_7$, and $Ce(SO_4)_2$.

Alkali is a highly effective promotion ingredient. For example, usable is an aqueous solution of caustic alkali at a pH value of 8 to 14, more preferably, 10 to 12. It gives the resist surface wettability/permeability, and makes the peeling-off action rapid. As alkali, usable are KOH, NaOH, $NaCO_3$, $Ca(OH)_2$ $Ba(OH)_2$, $NH_4OH$, TMAH, etc.

Figure 2:
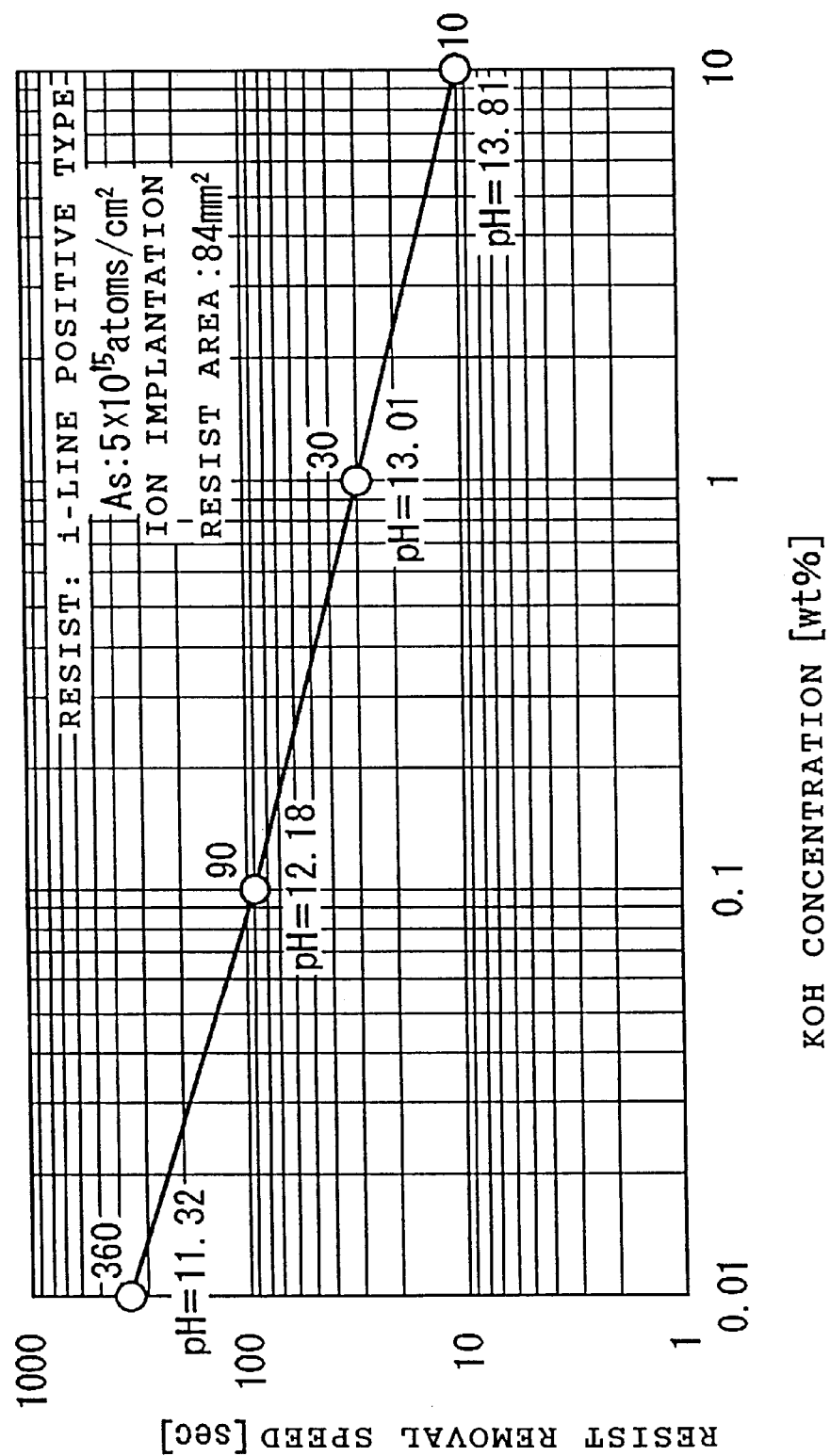
FIG. 2 is a graph showing the relation of the speed of removing a resist film by steam containing KOH, to the concentration of KOH.

More specifically, examined were the removing speeds of resist films which were used as a mask for ion implantation of impurities (As), when the resist films were removed using the technique shown in FIG. 1 and using KOH of alkali as a resist quality change promotion ingredient. FIG. 2 shows the result of measurement. In FIG. 2, the axis of abscissas represents the concentration (wt. %) of KOH, and the axis of ordinates represents the removing speed (sec). As shown in FIG. 2, the higher the KOH concentration is, the higher the removing speed is. This shows that the higher KOH concentration brings about the more efficient resist-peeling. However, too high KOH concentration may cause an adverse affection on a device material, so it is seemed that about 0.1 (wt. %) or less is proper.

Also acids and oxidative acids are promotion ingredients for change in quality. For example, $H_2SO_4$ makes a resist cross-link strongly. Usable are $H_2SO_4$, $HNO_3$, $HClO$, $HClO_4$, HCl, HF, etc.

Surface active agents have interfacial osmotic actions and surface functions for preventing peeled resist thin pieces from again adhering to the surface which they have been peeled off. As such surface active agents, usable are anionic, cationic, and nonionic surface active agents whose contact angles to resist surfaces are not more than 30 degrees, more preferably, not more than 20 degrees.

2. Peeling Resist Film by Ultraviolet Rays (1) Decomposition of Resist Film by Ultraviolet Rays:

Table 2 shows experimental data of decomposition tests of photoresists by ultraviolet rays. Light-decomposition of photoresists is possible by using a Xe excimer lamp (wavelength: 172 nm) as an ultraviolet lamp. But, the decomposition speed is too low to apply to removal of resist films. Although there is an attempt of acceleration by existence of ozone at a high concentration, putting it to practical use faces many hurdles.

TABLE 2

Decomposition of Photoresist by Ultraviolet Rays

| photoresist | untraviolet irradiation time (sec) | decrease in film thickness ($\mu$m) | speed of decomposition (nm/sec) | theoretical speed of decomposition (nm/sec) | quantum efficiency (%) |
|---|---|---|---|---|---|
| positive type resist 1400 $\mu$m thick | 2700 | 700 | 0.26 | 0.12 | 47 |

Xe excimer light source: wavelength of 172 nm;
irradiation light quantity: 10 mW/cm$^2$ on the outside of light source chamber window board sample surface irradiation conditions: air layer between light source and resist surface (distance=2 mm), surface temperature of 80° C.

The present inventors have perceived a change in quality of resists by ultraviolet rays. It aims not at resist decomposition but at resist-peeling. Since ultraviolet photons have strongly promoting actions for cross-linking or oxidation, the action of changing the quality of resists is intensive. An incorporated effect with a quality-change effect by steam is used. Besides, since ultraviolet rays have high resist transmissivity, they can fully reach the boundary layer of resist/substrate. It is an intensive permeating action. A change in quality of the boundary layer is directly related to the peeling effect.

3. Steam Supply Apparatus

Figure 3:
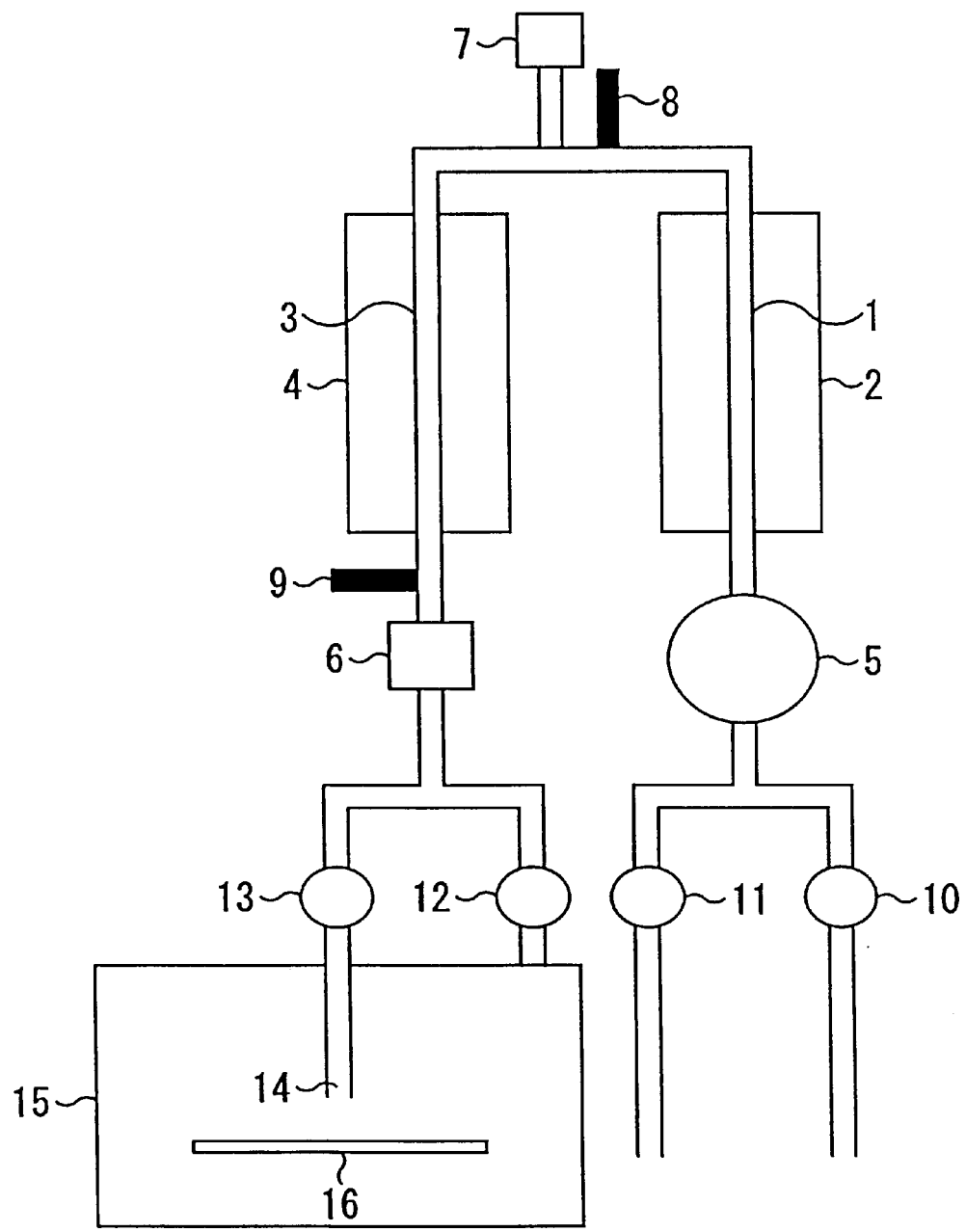
FIG. 3 is a schematic view showing a principal construction of a steam supply apparatus according to an embodiment of the present invention.

FIG. 3 shows the fundamental construction of a steam supply apparatus. An evaporator 1 and a heating block 2 for generating saturated steam, and a superheater 3 and a heating block 4 for generating superheated steam, are disposed between a fixed flow rate pump 5 and a pressure control needle valve 6. The internal pressure of this steam generation system is measured with a pressure gauge 7. The temperatures of saturated and superheated steams are measured with thermometers 8 and 9, respectively. The heating area in the evaporator 1 is so designed as to satisfy the burnout point condition of a boiling characteristic curve.

Switching Between Steam of Pure Water and Steam Containing Promotion Ingredient:

When steam of ultrapure water is generated, a valve 10 for an ultrapure water line is opened. When steam containing a promotion ingredient is generated, a valve 11 for an aqueous solution line is opened.

Switching Between Saturated and Superheated Steams:

When saturated steam is supplied, the heating block 4 for superheating is not supplied with heats. At this time, the superheater 3 merely functions as a passage for steam. When superheated steam is supplied, the heating block 4 is supplied with heats to perform superheating by the superheater 3.

Switching Between Steam-contact and Steam-spraying:

When steam is introduced into a process chamber 15, an introduction valve 12 is opened. When steam is sprayed onto a surface to be processed, a steam-spraying valve 13 is opened and steam is sprayed onto the surface 16 to be processed, through a steam-spraying nozzle 14.

Table 3 exemplifies control conditions for steam supply. Table 4 exemplifies conditions of the steam spraying nozzle. The nozzle shape/steam quantity/spraying velocity can freely be designed so as to meet the purpose.

TABLE 3

Control Condition for Steam Supply

| water supply quantity and heat quantity | | saturated steam generation conditions | | | superheated steam generation conditions | | |
|---|---|---|---|---|---|---|---|
| ml/sec | KWH | internal pressure Kg/cm$^2$ | temperature ° C. | steam quantity L/sec | internal pressure Kg/cm$^2$ | temperature ° C. | steam quantity L/sec |
| 1.5 | 3.9 | 1.0 | 100 | 2.55 | — | — | — |
| 1.5 | 3.9 | 2.0 | 120 | 2.69 | 1.00 | 120 | 2.69 |
| 1.5 | 4.0 | 3.6 | 140 | 2.83 | 1.00 | 140 | 2.83 |
| 1.5 | 4.0 | 6.0 | 160 | 2.96 | 1.00 | 160 | 2.96 | water supply quantity temperature: 20° C.; quantity of heat: net value (except radiation loss)

saturated steam: exemplified are only cases of 100 to 160° C.

superheated steam: exemplified are only cases of 100° C. saturated superheated steam generation

TABLE 4

Condition Example of Steam-spraying Nozzle

| steam quantity L/sec | point nozzle | | line slit nozzle | |
|---|---|---|---|---|
| | nozzle shape | steam-spraying linear velocity m/sec | nozzle shape | steam-spraying linear velocity m/sec |
| 2.55 | inside diameter of 5 mm | 120 | 200 mm × 0.5 mm | 52 |
| 2.55 | inside diameter of 10 mm | 32 | 200 mm × 1.0 mm | 13 |

4. Ultraviolet Reactor

Selections of the ultraviolet wavelength and time characteristics of a lamp used in an ultraviolet reactor are important technical factors.

Selection of Ultraviolet Wavelength:

The shorter the ultraviolet wavelength is, the greater the energy is and the lower the transmissivity to the irradiation atmosphere is. The ultraviolet wavelength must be so selected as to satisfy the objective transmissivity.

A relation between the light absorption sectional area of molecules present in the atmosphere and the light transmissivity, is given by expression (1).

Logarithms of the transmissivity are proportional to distances. The present inventors use 50% transmissive distance as an index. This 50% transmissive distance is given by expression (2). Table 5 shows relations between ultraviolet wavelengths and 50% transmissive distances to air, water, and steam obtained by expression (2) or actual measurements. For example, the 50% transmissive distance of ultraviolet rays of the wavelength of 172 nm to air is obtained as 3.1 mm from the light absorption sectional area of oxygen ($0.259 \times 10^{-19}$ molecules/cm$^2$) while the actual measurement of 2.2 mm was obtained. Both are practically almost equal.

$$\delta CL = ln(I°/I)$$

$\delta$: light absorption sectional area (molecules/cm$^2$) O$_2$ ... $0.259 \times 10^{-19}$ C: molecule concentration (partial pressure of molecule)

L: transmissive distance (cm)

I°/I: light transmissivity=incident light intensity/ transmitted light intensity ... (2)

$\delta CL_{50} = ln (100/50)$ $L_{50}$: 50% transmissive distance

TABLE 5

Ultraviolet Wavelength and 50% Transmissive distances to Air/Water/Steam

| excimer ultraviolet lamp | wavelength nm | energy eV | 50% transmissive distance | | |
|---|---|---|---|---|---|
| | | | air mm | water mm | steam mm |
| Xe excimer lamp | 172 | 7.21 | 3 | | |
| ArCl excimer lamp | 175 | 7.08 | 6 | <10 | <10 |
| | 185 | 6.70 | 40 | 10 | >1 × 10$^4$ |
| KrI excimer lamp | 191 | 6.49 | 100 | 28 | |
| ArF excimer lamp | 193 | 6.42 | >100 | 42 | |
| KrBr excimer lamp | 207 | 5.99 | | >100 | |
| KrCl excimer lamp | 222 | 5.58 | | | |
| low pressure mercury lamp | 185 · 254 | | | | |
| i-line lamp | 365 | 3.41 | | | |

Selection of Time Response:

An ultraviolet lamp is selected in accordance with the type of ultraviolet process, i.e., which of a moment type and a constant type is performed.

An ultraviolet excimer lamp can be used in a moment-type process. It reaches its stationary state in several seconds after being lit.

It is suitable for a sequential process in seconds in a one-by-one ultraviolet process. A low pressure mercury lamp, an i-line lamp, or the like, can be used in a constant-type process. Although they require scores minutes for reaching their stationary states after being lit, they are stable after then.

5. One-by-one Resist-peeling Apparatus (1) Construction of Apparatus:

A one-by-one resist-peeling apparatus comprises a steam process chamber and an ultraviolet lamp chamber.

The steam process chamber has a substrate taking-in/out system, an atmosphere purge system, and a liquid discharge system. In the chamber, a driving system is provided for moving a steam-spraying nozzle relatively to a substrate surface to be processed, so as to sweep the substrate surface. A point nozzle or a line slit nozzle is disposed in the chamber.

Figure 4:
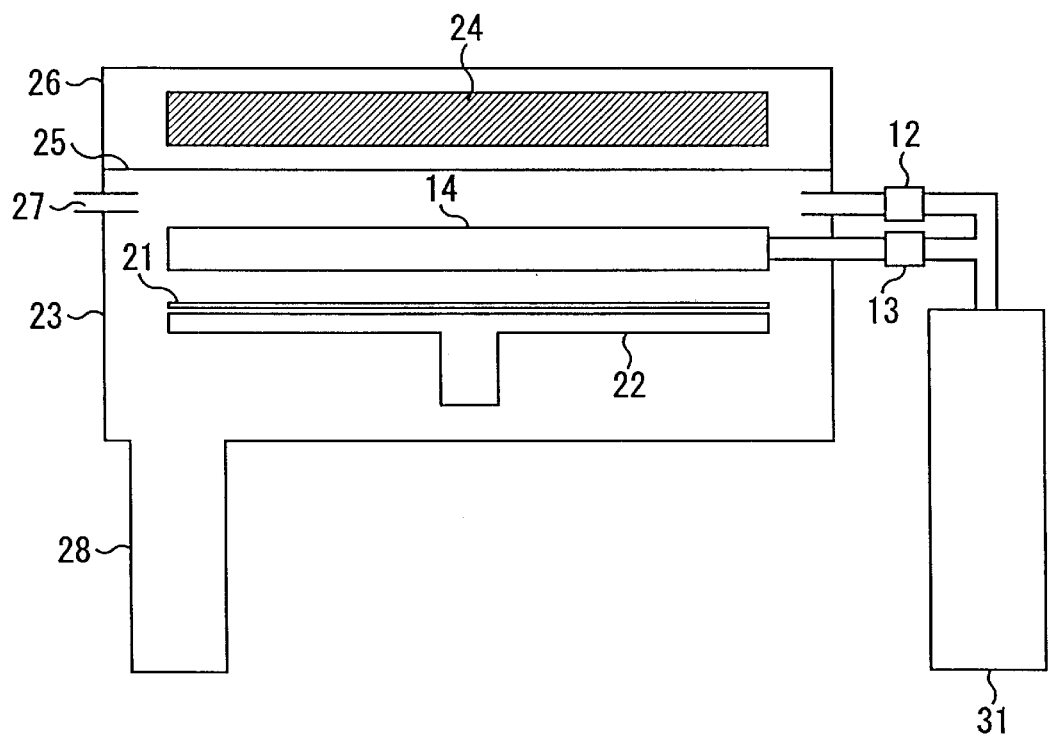
FIG. 4 is a schematic view showing a principal construction of a resist removal apparatus according to an embodiment of the present invention.

FIG. 4 shows a one-by-one resist-peeling apparatus including a spinning mechanism. This apparatus comprises a steam process chamber 23 provided with a spinning mechanism 22 for rotating a substrate 21, and a lamp chamber 26 including an ultraviolet lamp 24 and having a quartz window board 25. A gas inlet 27 to the chamber and a discharge duct 28 are accompanied.

When steam is introduced into the process chamber from the steam supply apparatus (see FIG. 3), the steam introduction valve 12 is opened. When steam is sprayed onto a surface to be processed, the steam-spraying valve 13 is opened and steam is sprayed onto the surface of the substrate 21 through the steam-spraying nozzle 14.

Shown is an example of the steam-spraying nozzle 14 in which a line slit nozzle is disposed in a radial direction.

Alternatively, usable is a system including a spot nozzle driven radially, or several nozzles movable in a proper distance or fixed. The spraying angle and spraying distance of the nozzle and the linear velocity of sprayed steam are optimized in various respects, such as the object of the process, the surface structure of the substrate, and protection for damage.

The steam process chamber 23 is kept in temperature. Steam is condensed little by little on the inner wall of the chamber. It serves for cleaning the inner wall. In this manner, the interior of the chamber is always kept clean.

The gas inlet 27 to the chamber is used for changing the atmosphere when a substrate is taken in/out. It is used also for adding an ingredient effective for the process, to the atmosphere. The discharge duct 28 preferably has a cooling structure.

(2) Physical Peeling Promotion:

Quenching (Rapidly Cooling) Resist Film:

Although not shown in FIG. 4, a carbonic acid gas-spraying nozzle can be disposed to be opposite to a substrate surface. It is for spraying carbonic acid gas and the resultant dry ice particles onto the substrate surface to quench (cool rapidly) the resist film. The resist film which was heated and swelled, shrinks/solidifies and is peeled off the substrate. It has been confirmed that such a quenching process promotes the peeling-off operation of some kinds of resists.

High-speed Spinning:

When the number of revolution of the substrate is set at 2000 rpm or more using the spinning mechanism, the peeling-off operation is promoted. In particular, the peeling-off operation is promoted when the steam-spraying effect is weak on the peripheral portion.

6. Making Resist-peeling Process and Surface-cleaning Process after Peeling Off, Sequential A resist-peeling process and a surface-cleaning process after resist-peeling can be a sequential process.

Switching from the resist-peeling apparatus to a surface-cleaning apparatus after resist-peeling is simple.

By altering the aqueous solution line 11 of the steam supply apparatus of FIG. 3 into a switching system between a peeling-promotion solution line 11A and a surface-cleaning solution line 11B, the resist-peeling apparatus and a surface-cleaning apparatus after resist-peeling can be switched freely.

Since the combination of the steam and ultraviolet processes effectively shortens both the peeling time and the cleaning time, the unity of the processes can be realized with no decrease in throughput.

EXAMPLE

Hereinafter, specific examples of the present invention will be described. Although the description is omitted in each example, the resist-peeling state is obtained by observing the peeled surface at each spraying time with an optical microscope.

Example 1

Shown are examples of peeling resist films by steam of pure water.

Figure 5A:
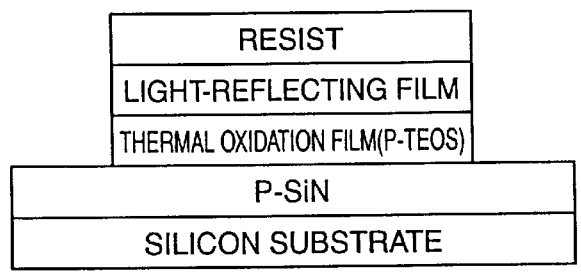
FIGS. 5A to 5E are schematic sectional views showing the constructions of samples from each of which a resist film is to be peeled off.
Figure 5B:
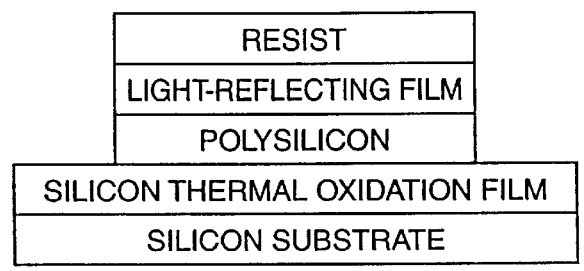

Sample: FIG. 5A; a resist film formed on a dry-etched thermal oxidation film;
FIG. 5B; a resist film formed on a dry-etched gate electrode (polysilicon film)
Steam: steam of pure water
Result of Peeling:
As shown in the below Table 6, peeling could be performed by spraying for thirty seconds to one minute.

TABLE 6

Steam Effect and Peeling Result

| | pure-water steam | spraying time | | |
|---|---|---|---|---|
| | | 15 sec | 30 sec | 1 min |
| oxide film dry-etched surface | 100° C. saturated steam | partially remained | fully peeled | |
| gate electrode etched surface | 100° C. saturated steam | — | partially remained | fully peeled | steam quantity: 2.55 L/sec; point nozzle: inside diameter of 10 mm, 32 m/sec

Example 2

Shown are examples of peeling resist films by steam containing promotion ingredients.

The resist films have been ion-implanted and are known to be very hard to peel off.

Figure 5C:
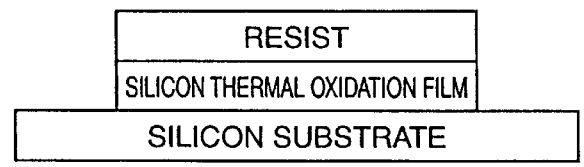

Sample: FIG. 5C; silicon thermal oxidation film dry-etched; its underlayer of a silicon substrate ion-implanted;
Ion-implantation conditions: acceleration energy of 80 keV; dose amount of phosphorus of $6 \times 10^{15}/cm^2$;
Promotion ingredient-containing steam: promotion ingredient; alkali (KOH) and a surface active agent.
Result of Peeling:
As shown in Table 7, peeling could be performed by spraying steam for two minutes. In case of the promotion ingredient of alkali, some peeled-off pieces adhering to the surface after peeling were observed. But, in case of the promotion ingredient of alkali+surface active agent, no peeled-off piece is found.

TABLE 7

Effect of Quality-change Promotion Ingredient and Peeling Result

| | quality-change promotion ingredient | spraying time | |
|---|---|---|---|
| | | 1 min | 2 min |
| oxide film etched/ion-implanted surface | alkali | partially remained | fully peeled (peeled-off pieces adhered) |
| oxide film etched/ion-implanted surface | alkali + surface active agent | partially remained | fully peeled (no peeled-off piece adhered) |

Example 3

Shown are further examples of peeling resist films by steam containing promotion ingredients.

Figure 5D:
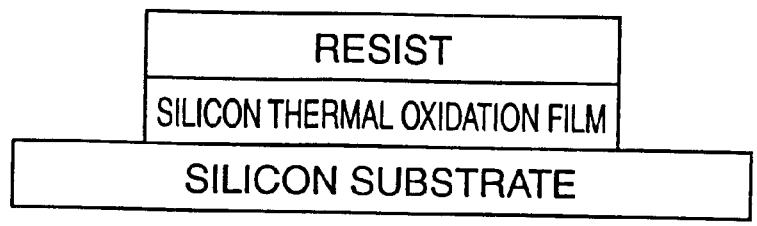
Figure 5E:
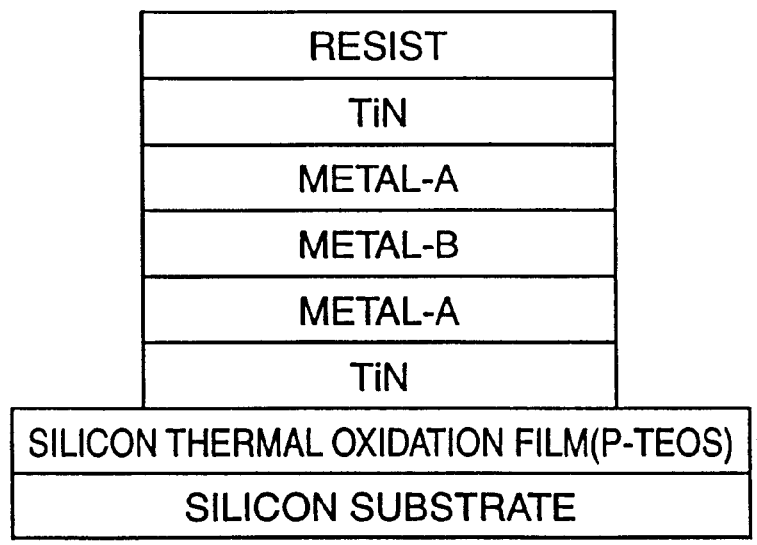

Sample: FIG. 5D; silicon thermal oxidation film wet-etched; a negative-type resist film;
FIG. 5E; after etching metal wiring; a positive-type resist film;
Promotion ingredient-containing steam: promotion ingredient; hydrogen peroxide and a surface active agent.
Result of Peeling:
The resist film was fully peeled off the surface of the thermal oxidation film by spraying steam containing the promotion ingredient for one minute. The resist film was fully peeled even off the etched metal wiring/ion-implanted surface inferior in ability of peeling, in two minutes.

TABLE 8

Effect of Quality-change Promotion Ingredient and Peeling Result

| | quality-change promotion ingredient | spraying time | | |
|---|---|---|---|---|
| | | 30 sec | 1 min | 2 min |
| oxide film wet-etched surface | hydrogen peroxide | partially remained | | fully peeled |
| metal wiring etched/ion-implanted surface | hydrogen peroxide | | partially remained | fully peeled |

Example 4

Shown are examples by two-step steam processes for metal-wiring surfaces.

Object of two-step process: it aims at avoiding chemical damage to metal wiring. A promotion ingredient is used when the metal-wiring surface is covered with a resist film. No promotion ingredient is used after the resist film is peeled off the metal-wiring surface to be exposed.
Details of two-step process:
first step (steam-contacting process); using steam containing alkali;
second step (steam-spraying process); using steam of pure water.

Result of Peeling:

Table 9 shows the results. The resist film was removed by the steam process of the second step for thirty seconds, and the metal wiring was not damaged.

For comparison, an example of process only with steam containing alkali is shown. This case required two minutes of spraying time, and some damages to the metal wiring on the surface after removing the resist film were observed.

TABLE 9

Effect of Two-step Steam Processing for Device

| | processing step | first step steam-contacting process | second step steam-spraying process | resist removal state [state of metal wiring] |
|---|---|---|---|---|
| condition | kind of steam removal promotion ingredient | saturated steam containing alkali | saturated steam no promotion ingredient | removed in process time of 1 min and 30 sec [no damage to metal wiring] |
| | temperature of steam | 100° C. | 100° C. | |
| | processing time | 1 min | 30 sec | |
| comparison | kind of steam removal promotion ingredient | no first step | saturated steam containing alkali | removed in spraying time of 2 min [damages to metal wiring] |
| | temperature of steam | | 100° C. | |
| | processing time | | 2 min | |

Example 5

Shown are examples by hot steam processes for ion-implanted resist films, which are hard to peel off.

Sample: FIG. 5C; silicon thermal oxidation film etched; its underlayer of a silicon substrate ion-implanted;

Ion-implantation conditions: acceleration energy of 80 keV; dose amount of phosphorus of $6 \times 10^{13}/cm^2$ Result of Peeling:

Table 10 shows the results.

In the 100° C. saturated steam process of the condition 1, the resist film could not be removed even by spraying for ten minutes.

In the 120° C. saturated steam process of the condition 2, the resist film could be removed by contacting process for two minutes and spraying process for one minute.

In the 140° C. superheated steam process after the 130° C. saturated steam process for thirty seconds of the condition 3, the resist film could be removed by spraying process for thirty seconds.

A quality-change effect by hot saturated steam and a peeling effect by superheated steam at a high temperature were confirmed.

TABLE 10

Effect of High-temperature Superheated Steam for Ion-implanted Resist Removal

| | processing step | first step steam-contacting process | second step steam-spraying process | resist removal result |
|---|---|---|---|---|
| condition 1 | kind of steam | no first step | saturated steam | could not be removed by spraying for 10 min |
| | temperature | | 100° C. | |
| | processing time of steam | | 10 min | |
| condition 2 | kind of steam | saturated steam | saturated steam | removed in processing time of 3 min |
| | temperature of steam | 120° C. | 120° C. | |
| | processing time | 2 min | 1 min | |
| condition 3 | kind of steam | saturated steam | superheated steam | removed in processing time of 1 min |
| | temperature of steam | 130° C. | 140° C. | |
| | processing time | 30 sec | 30 sec | |

Example 6

Shown are examples by combinations of steam and ultraviolet processes for ion-implanted resist films, which are hard to peel off.

Ultraviolet lamp: KrI excimer lamp, wavelength; 191 nm;

Ultraviolet irradiation quantity: 10 mW/cm² (surface to be processed).

Result of Peeling:

Table 11 shows the results.

After the 100° C. saturated steam process and the ultraviolet irradiation process for two minutes of the condition 1, the resist film could be removed by spraying process for one minute.

After the 120° C. saturated steam process and the ultraviolet irradiation process for thirty seconds of the condition 2, the resist film could be removed by spraying process for thirty seconds.

TABLE 11

Effect of Ultraviolet Irradiation Superimposition for Ion-implanted Resist Removal

| | processing step | first step steam-contacting process ultraviolet irradiation superimposition | second step steam-spraying process | resist removal state |
|---|---|---|---|---|
| condition 1 | kind of steam | saturated steam | saturated steam | removed in processing time of 3 min |
| | temperature of steam | 100° C. | 100° C. | |
| | processing time | 2 min | 1 min | |
| condition 2 | kind of steam | saturated steam | superheated steam | removed in processing time of 1 min |
| | temperature of steam | 120° C. | 130° C. | |
| | processing time | 30 sec | 30 sec | |

Example 7

Shown are examples by a sequential process of resist-peeling and surface-cleaning after peeling.

Ultraviolet lamp: KrI excimer lamp, wavelength; 191 nm;
Ultraviolet irradiation quantity: 10 mW/cm$^2$ (surface to be processed).

Resist-peeling Step:

Saturated steam at temperatures to meet various resist processes was used. Resist-peeling is performed by the first step of steam-contacting and the second step of steam-spraying with combining ultraviolet irradiation.

Cleaning Step:

Steams containing chemicals are generated by supplying the chemicals one after another through a cleaning liquid supply line. First, saturated steam containing fluoric acid and hydrogen peroxide is sprayed onto a substrate surface to remove metal and organic matters. At this time, particles are removed by the spraying power of a steam mist. Next, saturated steam containing diluted fluoric acid is sprayed onto the substrate surface. For example, the silicon surface of a contact hole in the substrate becomes bare silicon. Finally, steam of pure water is sprayed to wash. Such a chemical prescription is selected in accordance with the object of the process.

Drying Step:

Because superheated steam contains no mist, rapidly drying can be performed. Ultraviolet irradiation combined performs completion of surface-cleaning as well as a promotion of drying.

Result of Peeling:

Both the resist removal and the surface-cleaning were completely performed.

TABLE 12

| | Making Resist-peeling Process and Surface-cleaning Process after Peeling Sequential | | | |
|---|---|---|---|---|
| processing step | first/second step steam processing ultraviolet irradiation super imposition | cleaning step steam processing ultraviolet irradiation super imposition | | drying step steam processing ultraviolet irradiation super imposition |
| kind of steam | saturated steam | | | |
| temperature of steam | 100 to 140° C. | | | |
| processing time | according to each resist | | | |
| kind of steam | | saturated steam | | |
| temperature of steam | | 100 to 140° C. | | |
| kind of cleaning liquid | | fluoric acid/ hydrogen peroxide | dil. fluoric acid | pure water |
| cleaning time | | 15 sec | 15 sec | 10 sec |
| kind of steam | | | | superheated steam |
| temperature of steam | | | | 120 to 140° C. |
| drying time | | | | 10 sec |
| nitrogen introduction time | | | | 10 sec |

Various Embodiments According to Other Aspects of the Present Invention

As described above, the present inventors have realized techniques of peeling resist films with steam, besides, they have established techniques for combining them with promotion effects by chemical ingredients and effects by ultraviolet irradiation.

Additionally, the present inventors now propose techniques to make the peeling-off operation more sure and rapid by closely cross-combining applications of peeling actions, i.e., operations of peeling mechanisms, in relation to timely and spatial conditions, temperature conditions, and physicochemical conditions. That is, the present inventors grasp the peeling techniques from a new viewpoint that the properly cross-combining manners of the above conditions are considered, and make it possible to realize the techniques for this purpose and grasp them practically.

1. Cross-Combination of Process Conditions

In general, process conditions are mostly set in a stationary state. However, peeling a film is a phenomenon of a break of a stationary state, i.e., an adhering state. Therefore, peeling is a non-stationary phenomenon essentially. For example, a resist film is hydrated and swelled by an effect of steam, but it is never peeled off only by keeping the physicochemical state. A physical action, i.e., spraying, is required for peeling the film. Thus the peeling process requires a non-stationary cross-combination of various conditions.

Proper cross-combination is not a mere combination of different conditions. Proper cross-combination is an arrangement of conditions on the premise of an estimate and grasp of means and results. In detail, it includes interception condition design, inversion condition design, variation condition design, etc. A proper cross-combination of such process conditions produces an effect.

In particular, the following is the most principal reason why peeling techniques for resist films require such a proper cross-combination of process conditions. There is an untouchable ground that protection of the minute structure of the exposed surface after peeling must be ensured. In a peeling process, the surface of the resist film and the surface of the minute structure coexist temporarily. Conditions effective for peeling may cause damages on the minute structure surface. For reconciling peeling and protection of the minute structure surface, a proper cross-combination of process conditions is necessary.

2. Specific Modes of Proper Cross-Combinations of Process Conditions (1) Modes of Timely and Spatially Proper Cross-Combinations In modes of timely cross-combinations, for example, the order of operations of two conditions or mechanisms A and B is set at A→B, A←B, or A and B at once, and an operation time is set to either of A and B.

Modes of spatially proper cross-combinations include, e.g., cases of processing the whole surfaces, one surface, and a partial surface.

(2) Modes of Proper Cross-Combinations on Temperature

The portions to be heated and/or cooled are selected to the whole surfaces, one surface, or a partial surface to be processed. For example, a combination of one surface heating and one surface cooling is made. Preheating or rapid heating, or pre-cooling or rapid cooling is selected. Also possible are modes in which cross-combinations on temperature are further cross-combined timely or spatially.

(3) Modes of Physicochemically Proper Cross-Combinations

These modes include combinations on composition and combinations on concentration of chemical ingredients, and timely and spatially proper cross-combinations of applications of chemical ingredients. Irradiation with high frequency supersonic waves or ultraviolet rays may be combined.

The above modes (1), (2), and (3) can be properly cross-combined with one another.

3. Specific Examples of Proper Cross-Combinations of Process Conditions

Specific examples of proper cross-combinations will be described below, though the present invention is not limited to those examples.

(1) Cross-Combination of Steam-Contact and Steam-Spraying (Timely Cross-Combination)

A certain time is required for a resist film to be swelled and hydrated by a chemical action. For this process, suitable is a process of stationary contact with steam. After the resist film has changed in its quality due to the steam, spraying power of steam is required. That is, a steam-contact process is required. That is, a steam-contact process and a steam-spraying process should be combined at a time interval.

A specific example of this mode is the above example 4, which is a proper cross-combination of a steam-contact process, a steam-spraying process, and alkali.

(2) Cross-Combination of Saturated Steam Process and Superheated Steam Process (Timely and Physicochemically Proper Cross-Combination and Proper Cross-Combination on Temperature)

Saturated steam gives wetting conditions, and superheated steam gives hot drying conditions. For example, a 100° C. saturated steam process and a 100° C. saturated-150° C. superheated steam process are properly cross-combined. In the 100° C. saturated steam process, swelling and hydration of a resist film progress. In the 100° C. saturated-150° C. superheated steam process, the adhesion boundary of the resist film is dried, and this causes peeling at the boundary. Thus effective is a combination of the 100° C. saturated steam process and the 100° C. saturated-150° C. superheated steam process at a proper time interval.

Besides, a superheated steam process can be effectively used for drying after peeling and washing.

A specific example of this mode is the above example 5, which is a proper cross-combination of saturated and superheated steams.

(3) Cross-Combination of Steam Process and Chemical Ingredient-Containing Steam Process (Physicochemically and Timely Proper Cross-Combination)

It has been confirmed that a change in quality of a resist film is accelerated by steam containing a chemical ingredient. For example, steam containing an alkali ingredient can rapidly peel a resist film. However, if the underlayer is a minute structure of, e.g., a metal wiring surface, the wiring material such as aluminum or copper (in particular, aluminum) is etched and damaged by alkali. In this case, by using steam containing a certain kind of surface active agent, chemical damage on aluminum can be reduced to the extent that is usually negligible.

Specific examples of this mode are the above examples 2 and 3, which are proper cross-combinations of alkali and hydrogen peroxide.

(4) Cross-Combination of Steam Process and Isopropyl Alcohol (IPA) Vapor Process A resist-peeling effect of an IPA-water-salt base peeling liquid is known. Gas-liquid interface action of IPA is well-known as Marangoni effect. The present inventors have found that IPA vapor shows an resist-peeling promotion effect in an atmosphere of steam. Since IPA is an organic chemical ingredient which never acts on a surface material, it can be used without any damage on a metal wiring surface.

Cross-Combination Mode 1: (timely and Physicochemically proper Cross-combination)

A steam process and an IPA vapor process are timely cross-combined.

Cross-Combination Mode 2: (Physicochemically Proper Cross-combination)

An IPA vapor process, i.e., a composition of chemical ingredient is cross-combined.

Example 8

Effects of cross-combinations of IPA vapor processes in steam processes were examined in relation to various kinds of resist films.

By cross-combined process conditions shown in the below table 13, resist-peeling could be performed in one to two minutes.

TABLE 13

Cross-Combination with IPA Vapor Process

| | combined processes | time distribution | resist removal time |
|---|---|---|---|
| cross-combination mode 1 | first step: steam process<br>second step: IPA vapor process<br>third step: steam process | 0.4<br>0.2<br>0.4 | 1–2 min |
| cross-combination mode 2 | IPA-containing steam process | — | 1–2 min | time distribution: ratio of each process time to the whole process time

IPA-containing steam: IPA/steam=0.1/1.0 (volume ratio)

steam: 120° C. saturated steam, 2.5–5 L/sec (substrate spinning)

(5) Cross-Combination of Steam Process and Water-spraying Process and Application of High-frequency Supersonic Waves There are resist films which can fully be peeled off by the spraying power of steam after a steam process, and resist films which require certain times for being peeled off only by the spraying power of steam. In the latter case, a cross-combination of a water-spraying process is effective. When the sprayed quantities are the same, the collision power of water is greater than that of steam in proportion to the difference in mass by about three figures. Besides, the resist which has been softened at the temperature of steam, is cooled by sprayed water to be hardened. This serves as an additional peeling action.

Highly compressed water, i.e., a jet water stream is used for cutting a silicon wafer or as a surgical knife. Spraying compressed water can peel any stable film, but protection of the surface to be minutely processed, from being damaged, must be fully ensured. Therefore, important is design of the linear velocity of sprayed water, for relieving pressure and sprayed quantity, i.e., for protection of minute structure.

Cross-Combination Mode 1: (Timely and Physicochemically Proper Cross-combination)

A water-spraying process at a relieved pressure is performed after a steam-contact process. Obtained is a united effect of a pyrogenetic chemical reaction of steam and a cooling action of compressed water.

Cross-Combination Mode 2: (Spatially Proper Cross-combination and Proper Cross-combination on Temperature)

In spinning a surface, a steam-spraying process is performed on one side, and a water-spraying process is performed on the other side. Vibration of temperature is thereby applied to the surface in a cycle of heating and cooling in accordance with the spinning speed. Also in this cross-combination mode, the same peeling effect as the above can be obtained.

Cross-Combination Mode 3: (Physicochemically Proper Cross-Combination)

In one of the above cross-combination modes 1 and 2, the water-spraying process is performed using a high-frequency supersonic nozzle. Because the spraying energy and the supersonic energy are summed to increase the peeling power, the process is performed under conditions by which each energy is relieved in order to ensure the protection of the target minute circuit structure.

Example 9

Effects of cross-combinations of steam processes and water-spraying processes and applications of high-frequency supersonic waves were examined in relation to various kinds of resist films. By cross-combined process conditions shown in the below table 14, resist-peeling could be performed in one to two minutes.

TABLE 14

Cross-Combination with Water spraying Process and High-frequency Supersonic Process

| | combined process | time distribution | resist removal time |
|---|---|---|---|
| cross-combination mode 1 | first step: steam contact<br>second step: water spraying | 0.5<br>0.5 | 1–2 min |
| cross-combination mode 2 | one surface steam spraying<br>one surface water spraying | simultaneous<br>simultaneous | 1–2 min |
| cross-combination mode 3 | one surface steam spraying<br>one surface water spraying<br>with applying high-frequency supersonic | simultaneous<br>simultaneous | 1–2 min | steam: 120° C. saturated steam, 2.5–5 L/sec (substrate spinning)

(6) Cross-Combination of Steam Process and Compressed Carbonic Acid Gas-spraying Process This cross-combination produces a special effect in addition to the effect of cooling and hardening in the cross-combination of the above water-spraying process.

The temperature of fine dry ice particles generated by spraying compressed carbonic acid gas, is −55° C. Moisture which has permeated into the adhesion boundary in the steam process, momentarily crystallizes and expands by spraying carbonic acid gas. This freezing of the moisture brings about an effect of ice columns, and serves as a strong additional peeling power.

Cross-Combination Mode 1: (Timely and Physicochemically Proper Cross-combination and Proper Cross-combination on Temperature)

By alternately repeating a steam process and a compressed carbonic acid gas-spraying process, obtained is a peeling effect by temperature vibration of heating and cooling. This is because the coefficient of expansion varies in accordance with the kind of material. For example, the linear expansion coefficient of silicon is $0.076 \times 10^{-4}/K$, while those of many organic materials are 2.2 to $5.0 \times 10^{-4}/K$. There is a difference by about one to two figures. The difference in linear expansion coefficient between a silicon substrate and a resist film brings about a peeling power at the boundary by the temperature amplitude of about 150° C.

Cross-Combination Mode 2: (Spatially and Physicochemically Proper Cross-combination and Proper Cross-combination on Temperature)

In spinning a surface, a steam-spraying process is performed on one side, and a compressed carbonic acid gas-spraying process is performed on the other side. Vibration of temperature is thereby-applied to the surface in a cycle of heating and cooling in accordance with the spinning speed. Also in this cross-combination mode, the same peeling effect as the above can be obtained.

Cross-Combination Mode 3: (Spatially and Physicochemically Proper Cross-combination and Proper Cross-combination on Temperature)

A steam-spraying process is performed onto the resist-side surface of a substrate, and a compressed carbonic acid gas-spraying process is performed onto the opposite surface of the substrate. A difference in temperature is thereby made between the resist film and the substrate at their boundary. Also in this cross-combination mode, the same peeling effect as the above can be obtained.

Example 10

Effects of cross-combinations of steam processes and compressed carbonic acid gas-spraying processes were examined in relation to various kinds of resist films. By cross-combined process conditions shown in the below table 15, resist-peeling could be performed in one to two minutes.

TABLE 15

Cross-Combination with Compressed Carbonic Acid Gas spraying Process

| | combined process | time distribution | resist removal time |
|---|---|---|---|
| cross-combination mode 1 | steam spraying 5 sec/process CO$_2$ gas spraying 5 sec/process | alternate alternate | 1–2 min |
| cross-combination mode 2 | one surface steam spraying one surface CO$_2$ gas spraying | simultaneous simultaneous | 1–2 min |
| cross-combination mode 3 | front surface steam spraying back surface CO$_2$ gas spraying | simultaneous simultaneous | 1–2 min | steam: 120° C. saturated steam, 2.5–5 L/sec (substrate spinning)

(7) Cross-Combination of Steam Process and Substrate Cooling Process (Proper Cross-combination on Temperature)

The resist-side surface of a substrate is processed by steam with supporting the substrate on a cooling plate. The cooling plate may perform cooling by any of an electronic cooling method using a Peltier element, a fluoric oil coolant circulation method, and a ventilation cooling method by spraying compressed carbonic acid gas.

Obtained are the same united effect and peeling action as those by cooling by the above water- or compressed carbonic acid gas-spraying process.

Example 11

Effects of cooling substrates in steam processes were examined in relation to various kinds of resist films. The cross-combination order of a steam-spraying process and a substrate cooling process and the process time of each of them vary in accordance with the kind of resist, so conditions to obtain greater effects are selected. The below table 16 shows examples of such conditions. By the conditions shown, resist-peeling could be performed in one to two minutes.

TABLE 16

Cross-Combination with Substrate Cooling Process

| | combined process | time distribution | resist removal time |
|---|---|---|---|
| cross-combination mode 1 | substrate cooling step steam spraying step | 0.5 0.5 | 1–2 min |
| cross-combination mode 2 | front surface steam spraying (120° C. saturated) back surface cooling | 0.5 0.5 | 1–2 min | steam: 120° C. saturated steam, 2.5–5 L/sec (substrate spinning)

substrate cooling: Peltier element electronic cooling method, substrate temperature: −10° C.

(8) Cross-Combination of Steam Process and Ultraviolet Irradiation Process (Physicochemically Proper Cross-combination)

In case of combination with a steam process, used are ultraviolet rays whose 50% transmissive distance to steam is 2 mm or more. A combination with a superheated steam process is effective. Since superheated steam contains no mist, scattering loss of ultraviolet rays is little. A light quantity and an irradiation time of ultraviolet rays suffice if they bring about a change in quality of the adhering surface of a resist film by a photochemical action.

A specific example of this mode is the above example 6, which is a proper cross-combination of steam and ultraviolet rays.

(9) Cross-Combination of High-pressure Carbonic Acid Gas Process and Ultraviolet Irradiation Process (Physicochemically Proper Cross-Combination)

In an atmosphere of carbonic acid gas, even short-wavelength ultraviolet rays whose 50% transmissive distance to steam is less than 2 mm, can be used with a high transmissivity. The transmissive distance of ultraviolet rays of the wavelength of 172 nm is about 30 cm. That is, a Xe excimer lamp (wavelength: 172 nm) can be used. This is effective to decompose and remove fine resist pieces which have remained within fine gaps of the structure after peeling a resist film.

Example 12

In case of processes of peeling resist films off device surfaces having minute structural patterns, after which processes fine resist pieces remain at the corners of the patterns and within gaps of wiring patterns, decomposing and removing processes for the remaining resist pieces were performed by ultraviolet irradiation processes.

Surfaces to be processed were irradiated by a Xe excimer lamp with spraying carbonic acid gas onto the surfaces. The below table 17 shows the results.

TABLE 17

Ultraviolet Irradiation Process for Remaining Resist Pieces

| resist remaining state | ultraviolet irradiation time | surface SEM inspection after process remaining resist |
|---|---|---|
| remaining a little in minute pattern gaps | 10–20 sec | could not detect |

TABLE 17-continued

Ultraviolet Irradiation Process for Remaining Resist Pieces

| resist remaining state | ultraviolet irradiation time | surface SEM inspection after process remaining resist |
|---|---|---|
| resist residues scattered | about 1 min | could not detect |

Xe excimer lamp: irradiation quantity 20 mW/cm$^2$ (substrate spinning)

(10) Cross-Combination with Cleaning Process

The purification level of the surface which a resist film has been peeled off, or the purification level of the surface required in the subsequent process varies in accordance with the process in question. Therefore required is a system in which proper cross-combinations of steam conditions and a cross-combination of ultraviolet irradiation can easily be set.

A specific example of this mode is the above example 6, which is a cross-combination with a cleaning process.

4. Resist Film Removing Apparatus

A specific example of resist film removing apparatus wherein cross-combination modes of various processes (means) are taken into consideration, will be described.

Figure 6:
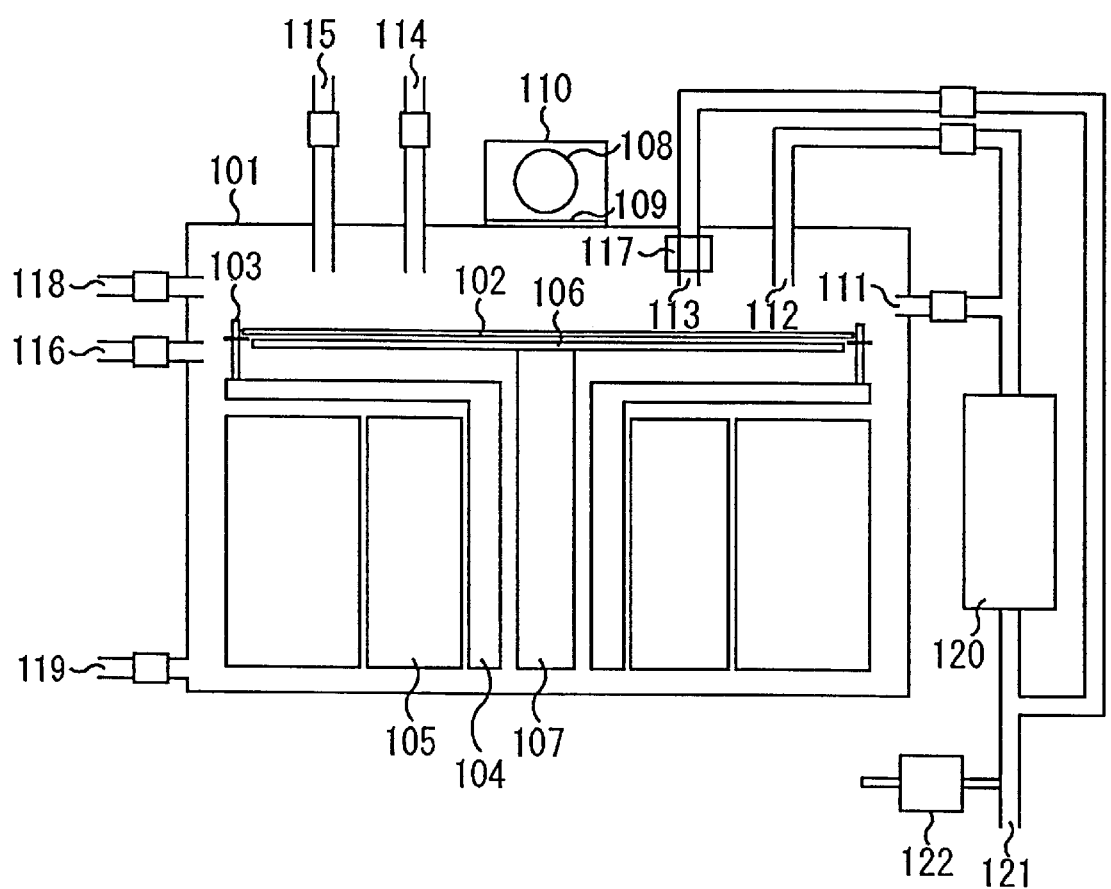
FIG. 6 is a schematic sectional view of a one-by-one resist film removing apparatus including a spinning mechanism.

FIG. 6 is a schematic sectional view of a one-by-one resist film removing apparatus including a spinning mechanism.

This resist film removing apparatus is provided with a chamber having a substrate taking-in/out system, an atmosphere purge system, and a discharge system. In the chamber, in addition to a system for introducing steam, provided is at least one of systems for respectively introducing IPA vapor, water, and compressed carbonic acid gas; a system for adding a chemical ingredient to the above steam or water; systems for respectively performing irradiation with ultraviolet rays and high-frequency supersonic waves; and a system for heating and cooling substrates. A driving system is provided for moving each spraying nozzle relatively to the front or back surface of a substrate so as to sweep the surface.

A spinning mechanism is provided in the steam process chamber 101. The spinning mechanism comprises a rotor 104 provided with support pins 103 for fixing a substrate 102, and a hollow cylindrical motor 105.

As a substrate cooling system, a cooling plate 106 is supported by a supporting mechanism fixed in the motor 105.

As an ultraviolet irradiation system, a lamp chamber 110 including an ultraviolet lamp 108 and having a quartz window board 109 is disposed on the upper part of the steam process chamber 101. FIG. 6 shows a cross section of the ultraviolet lamp 108.

As systems for respectively introducing steam, water, IPA vapor, and compressed carbonic acid gas, the steam process chamber 101 is provided with a steam inlet 111 and a steam spraying nozzle 112, a water spraying nozzle 113, an IPA vapor spraying nozzle 114, and a compressed carbonic acid gas spraying nozzle 115. A rear side nozzle 116 for compressed carbonic acid gas is used for cooling the substrate 102 in place of the cooling plate 106.

As a high-frequency supersonic irradiation system, the water spraying nozzle 113 is provided with a high-frequency supersonic oscillator 117. The shape of each spraying nozzle is schematically shown in FIG. 6.

The steam process chamber 101 is further provided with an atmosphere purge gas inlet 118 and a discharge system 119.

As a system for adding a chemical ingredient to steam or water, a chemical injecting device 122 comprising a fixed flow rate pump is connected to an ultrapure water supply line 121 for a steam generator 120 and the water spraying nozzle 113.

What is claimed is:

1. A method for removing a resist film used in a lithographic process, wherein saturated steam is sprayed onto said resist film, and said resist film is peeled off by an action of said saturated steam.

2. A method as set forth in claim 1, wherein the temperature of said saturated steam at the resist film is within the range of 70° C. to 100° C.

3. A method as set forth in claim 1, further comprising at least one of:

a step of making water act on said resist film;

a step of making vapor of isopropyl alcohol act on said resist film;

a step of making compressed carbonic acid gas act on said resist film;

a step of adding a chemical ingredient into said steam and/or said water;

a step of irradiating said resist film with ultraviolet rays;

a step of applying high-frequency supersonic waves to said resist film; or a step of cooling a substrate on which said resist film is formed.

* * * * *

UNITED STATES PATENT AND TRADEMARK OFFICE
CERTIFICATE OF CORRECTION

PATENT NO. : 6,610,168 B1
DATED : August 26, 2003
INVENTOR(S) : Nobuhiro Miki et al.

It is certified that error appears in the above-identified patent and that said Letters Patent is hereby corrected as shown below:

<u>Title page,</u>
Item [73], Assignee, should read:
-- Sipec Corporation --

Signed and Sealed this

Thirtieth Day of December, 2003

JAMES E. ROGAN
*Director of the United States Patent and Trademark Office*